United States Patent
Parthasarathi

[11] Patent Number: 5,817,544
[45] Date of Patent: Oct. 6, 1998

[54] ENHANCED WIRE-BONDABLE LEADFRAME

[75] Inventor: Arvind Parthasarathi, North Branford, Conn.

[73] Assignee: Olin Corporation, New Haven, Conn.

[21] Appl. No.: 584,934

[22] Filed: Jan. 16, 1996

[51] Int. Cl.[6] .................................................. H01L 21/60
[52] U.S. Cl. .......................................... 438/123; 438/111
[58] Field of Search ................................... 437/209, 214, 437/217, 219, 220; 438/121, 123, 110, 111, 112

[56] References Cited

U.S. PATENT DOCUMENTS

| | | |
|---|---|---|
| 4,131,517 | 12/1978 | Mitsuo et al. . |
| 4,428,987 | 1/1984 | Bell et al. . |
| 4,521,469 | 6/1985 | Butt et al. . |
| 4,531,285 | 7/1985 | Lucas ........................................ 29/827 |
| 4,707,724 | 11/1987 | Suzuki et al. . |
| 4,733,292 | 3/1988 | Jarvis ....................................... 437/220 |
| 4,888,449 | 12/1989 | Crane et al. . |
| 4,939,316 | 7/1990 | Mahulikar et al. . |
| 5,022,968 | 6/1991 | Lin et al. . |
| 5,098,796 | 3/1992 | Lin et al. . |
| 5,205,036 | 4/1993 | Yamazaki ................................ 437/217 |
| 5,221,859 | 6/1993 | Kobayashi et al. . |
| 5,360,991 | 11/1994 | Abys et al. .............................. 257/666 |
| 5,382,546 | 1/1995 | Yamada et al. ......................... 437/220 |
| 5,449,951 | 9/1995 | Parthasarathi et al. . |
| 5,459,103 | 10/1995 | Kelleher et al. ........................ 437/220 |
| 5,593,927 | 1/1997 | Farnworth et al. ..................... 437/217 |

OTHER PUBLICATIONS

Wolf et al., *Silicon Processing for the VLSI Era*, vol. 1: Process Technology, Lattice Press, Sunset Beach, California 1986, pp. 535–536.

*Primary Examiner*—Kevin Picardat
*Attorney, Agent, or Firm*—Gregory S. Rosenblatt; Thomas F. Presson; Wiggin & Dana

[57] ABSTRACT

A method for improving adhesion from a leadframe to a metallic wire is disclosed including using a laser beam to remove selected areas of an package adhesion enhancing layer to expose a layer on the leadframe which has a higher adhesion to metallic wires. The package adhesion enhancing layer is from the group consisting essentially of aluminum oxide, anti-tarnish finishes, and dielectrics.

The exposed layer on the leadframe is selected from the group consisting essentially of silver, nickel, palladium.

11 Claims, 2 Drawing Sheets

ENHANCED WIRE-BONDABLE LEADFRAME

BACKGROUND OF THE INVENTION

1. Field of the Invention

This invention relates generally to leadframe for electronic packages. More particularly, this invention relates to enhancing a bond between a metallic wire and a coated leadframe.

2. Description of the Related Art

One type of package used to house microelectronic devices, such as silicon-based integrated circuits, is a molded plastic package. The package is low cost, easy to assemble and provides adequate protection of the device from water vapor and other contaminants. During assembly, an electronic device is mounted on a die attach paddle and electronically interconnected to the leadframe. The die attach paddle, electronic device, and an inner portion of the leadframe are then encapsulated in a molding resin, such as by transfer molding. The resin forms a hard, relatively moisture impervious shell to protect both the device and electrical connections.

After encapsulation, the outer leads of the leadframe may be soldered to a printed circuit board or other external device. The temperature of the package during soldering may rise to about 260° C. Any water vapor trapped within the package will convert to steam and expand. One site for the accumulation of water is under the die attach paddle. When the accumulated water expands, the base of the molded plastic package deforms, leading to what is known as the "popcorn" effect.

Moisture also penetrates the plastic package along the interface between the leads and molding resin. The adhesion between the resin and leads is primarily mechanical in nature and a gap may exist between the leads and encapsulation. Moisture travels through the gap, accumulating at the die attach paddle.

Various mechanisms to improve the bond between the leadframe and molding resin and to reduce leadframe tarnishing have been proposed. Most leadframe are coated either with a material to improve adhesion between the leadframe and the molding resin or with an organic material to reduce leadframe tarnishing. For example, U.S. Pat. No. 4,862,246 to Masuda et al. discloses forming a series of hemispherical depressions in the die attach paddle to increase the adhesion to the molding resin.

A layer of dull nickel applied to a leadframe has been found to increase an epoxy bond as disclosed in U.S. Pat. No. 4,888,449 to Crane et al. The Crane et al. patent also discloses coating metallic package components with a metal or metal alloy selected from the group consisting of nickel, tin, cobalt, chromium, molybdenum, tungsten, titanium, zirconium, hafnium, niobium, tantalum, germanium, aluminum, and alloys thereof.

Another coating is disclosed in U.S. Pat. No. 4,428,987 to Bell et al. The Bell et al. patent discloses pre-treating a copper surface to improve adhesion. The surface is electrolytically reduced and then coated with a benzotriazole solution.

U.S. Pat. No. 5,122,858 to Mahulikar et al. discloses that coating a leadframe with a thin polymeric layer improves the adhesion between the leadframe and molding resin. U.S. Pat. No. 5,122,858 is incorporated in its entirety herein.

U.S. Pat. No. 5,449,951 to Parthasarathi et al. discloses coating a metallic leadframe with a plurality of layers, the outermost layer is either chromium, zinc, or a mixture thereof with a mixture most preferred. U.S. Pat. No. 5,449,951 is incorporated in its entirety herein.

Molded plastic packages have a monolithic body, however, other electronic packages are formed from discrete base and cover components. One such package is described in U.S. Pat. No. 4,939,316 to Mahulikar et al. The package has anodized aluminum base and cover components with a leadframe disposed between. A polymer adhesive bonds the leadframe to both the base and cover. Other packages having discrete bases and covers have copper, copper alloy, ceramic, or plastic components.

Although the above leadframe treatments and coatings improve the adhesion between the package and the leadframe, they generally provide a weaker bond to the wires connecting the leadframe to the semiconductor device. Thus, a leadframe is needed that improves adhesion between the package and the leadframe, while at the same time providing stronger bonds between the leadframe and the wires connecting the leadframe and the semiconductor device.

SUMMARY OF THE INVENTION

Accordingly, it is an object of the invention to provide a leadframe with both improved adhesion to an electronic package as well as improved adhesion to a bonded wire. It is a feature of the invention that the leadframe includes an adhesion enhancing coating which is laser ablated where wires are to be bonded.

In accordance with the invention, there is provided a method for improving adhesion from a leadframe to a metallic wire comprising the steps of providing the leadframe substantially coated with a coating which has a lower adhesion to the metallic wire than the leadframe and applying a laser beam to selected areas of the coating to remove the coating.

Further in accordance with the invention, there is provided a leadframe comprising an electrically conductive substrate formed in a plurality of leads having a first layer coating an inner lead portion of the substrate, wherein a portion of the first layer has a surface characteristic of being reflowed, and a second layer coating at least that portion of the substrate free of the first layer selected from the group consisting essentially of aluminum oxide, anti-tarnish finishes, and dielectrics.

Still further in accordance with the invention, there is provided a method of attaching a metallic wire to a leadframe comprising the steps of providing a leadframe, applying a laser beam to a wire bonding site to partially melt the leadframe, and bonding the wire to the metallic wire bonding site. The bonding step occurs while the leadframe is still partially melted at the wire bonding site.

The accompanying drawings are included to provide a further understanding of the invention and are incorporated in and constitute a part of the specification illustrating embodiments of the invention and together with the description serve to explain the principles of the invention.

IN THE DRAWINGS

DETAILED DESCRIPTION

A leadframe according to the present invention includes an electrically conductive substrate coated with at least a first layer which is partially removed by a laser beam.

Reference will now be made in detail to the present preferred embodiments of the invention, examples of which are illustrated in the accompanying drawings.

Figure 1:
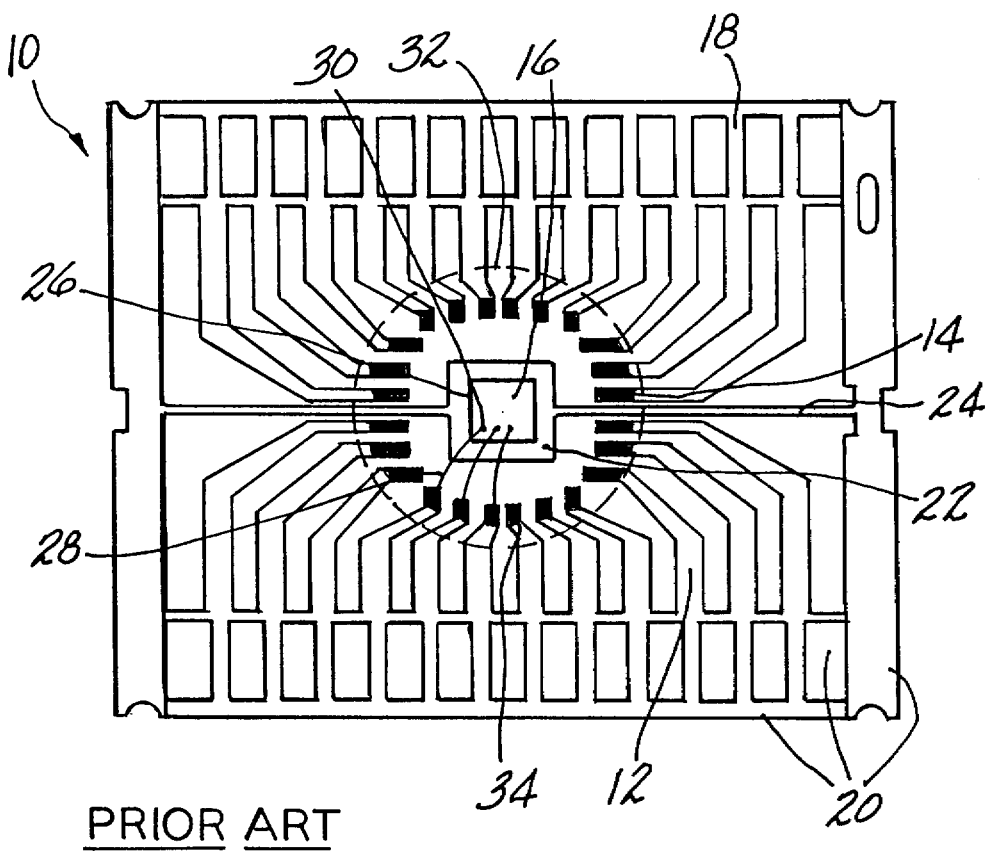
FIG. 1 illustrates a leadframe as known in the prior art.

FIG. 1 illustrates a conventional leadframe and denoted generally by the reference numeral 10. The leadframe 10 is comprised of an electrically conductive material. Leadframe are typically fashioned from alloy 42 (an iron/nickel alloy containing nominally 58% iron and 42% nickel by weight), KOVAR (an iron/nickel/cobalt alloy nominally containing 54% iron, 29% nickel, and 17% cobalt by weight), copper or a copper based alloy. The leadframe may be plated or clad with a second material to improve wire bondability, enhance bonding to a sealant, improve corrosion resistance, or improve appearance.

Typically, the leadframe for a metal package is a copper based alloy such as C638 (nominal composition 95% copper, 2.8% nickel, 1.8% silicon, and 0.4% cobalt by weight) described in U.S. Pat. Nos. 3,341,369 and 3,475,227 to Caule et al. or C724 as described in U.S. Pat. No. 4,594,221 to Caron (nominal composition 95.4% copper, 3% nickel, 0.6% silicon, and 0.1% manganese by weight). Leadframe 10 is comprised of lead fingers 12 which are made up of inner lead portions 14, for connecting to an electronic device 16, and outer lead portions 18, for electrically conducting the electronic device 16 to an external device, for example, by insertion into a printed circuit board. Leadframe 10 also contains tie bars 20 to support lead fingers 12 during assembly. Tie bars 20 are generally severed once leadframe 10 is in place to electrically isolate lead fingers 12 from each other.

Some leadframe also contain a centrally positioned die attach pad 22 which is connected to tie bars 20 by die attach pad supports 24. Leadframe with die attach pads are usually used in plastic encapsulated packages to provide a site to mount the electronic device and provide electrical contact to the back side of the device.

The use of a die attach pad in a plastic encapsulated package is disclosed, for example, in U.S. Pat. No. 4,697,203 to Sakai et al.

The use of a die attach pad with a metal package is disclosed, for example, in U.S. Pat. No. 4,656,499 to Butt.

Electronic device 16 which is typically a semiconductor chip made of silicon, although other semiconductor materials such as geranium or gallium arsenide may also be used, and is attached to die attach pad 22 by a die attach material 26. The electronic device 16 is next connected to the inner lead portions 14 via bonding wires 28. These wires are frequently made thin, about 0.001" diameter strands of gold, aluminum, or alloys thereof. In the alternative, thin strips of copper foil are used for TAB bonding as disclosed in U.S. Pat. No. 4,330,790 issued to Burns. The wires 28 are bonded by conventional wire bonding techniques to bonding sites 30 on the electrically active face of the electronic device 16. The opposite ends of the wires are bonded to the inner lead portions 14 of the leadframe 10, thereby creating an electric connection between electronic device 16 and the outer lead portions 18. Conventional wire bonding techniques may include, for example, ultrasonic or thermosonic bonding. Bonding wires 28 may be any material effective to conduct current.

In an area denoted generally by reference numeral 32, a bonding layer 34 may be provided to increase wire bond integrity between the leadframe 10 and bonding wires 28. Such a bonding layer 34 is usually selected from the group consisting of nickel, palladium, silver, gold, aluminum, and alloys thereof. Generally, this layer is a minimum of 2 micro-inches in thickness and depends on the type of material used for bonding layer 34. For example, if silver is used, the thickness is from about 100 micro-inches to about 200 micro-inches. Other types of adhesion enhancing layers may also be used or alternatively, an adhesion enhancing layer may not be present. Typically, a package adhesion layer 36 is subsequently applied over the entire surface of leadframe 10 and any bonding layer 34 or adhesion layers which may be present as well as any anti-tarnish layers. This package adhesion layer 36 provides enhanced bond adhesion between leadframe 10 and an encapsulating molding resin, or a polymer attaching a metallic base and cap to the leadframe package.

Package adhesion layer 36 is usually selected from the group consisting of aluminum oxides, anti-tarnish finishes, and dielectrics. Alternatively, more than one layer may be present, for example, an anti-tarnish layer and a layer to improve bonding between a leadframe and a molding resin. An aluminum oxide coating, such as an anodic film having an integral dark color is described, for example, in U.S. Pat. No. 5,066,368 to Pasqualoni et al. and an anti-tarnish finish, such as a codeposited layer of chromium and zinc with a preferred atomic ratio of zinc to chromium in excess of 4:1, for example is disclosed in U.S. Pat. No. 5,022,968 to Lin et al. Both of these patents are hereby incorporated herein by reference.

Figure 2:
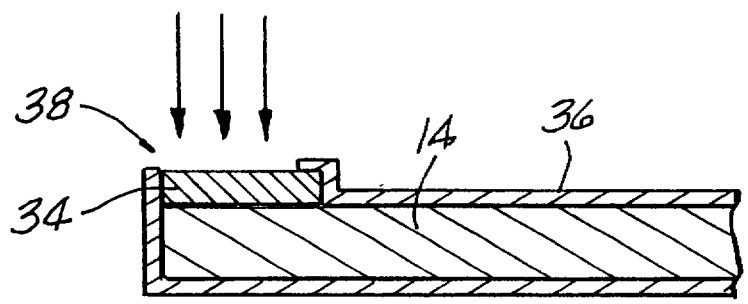
FIG. 2 illustrates a partial cross section of a leadframe according to the present invention.

FIG. 2 shows a partial cross-sectional view of inner lead portions 14 according to a preferred embodiment. In this Figure, inner lead portions 14 are partially coated with bonding layer 34 and package adhesion layer 36. In a laser ablation site 38, package adhesion layer 36 is removed to expose bonding layer 34. Bonding layer 34 provides better adhesion to a metallic bonding wire 28 than does package adhesion layer 36. Thus, leadframe 10 has an adhesion between metallic wire 28 and leadframe 10 as if package adhesion layer 36 had not been applied. But, because of the presence of package adhesive layer 36 on the remainder of leadframe 10, adhesion between leadframe 10 and an encapsulating molding resin or resin bonding a metallic base and cap remains high.

Figure 3:
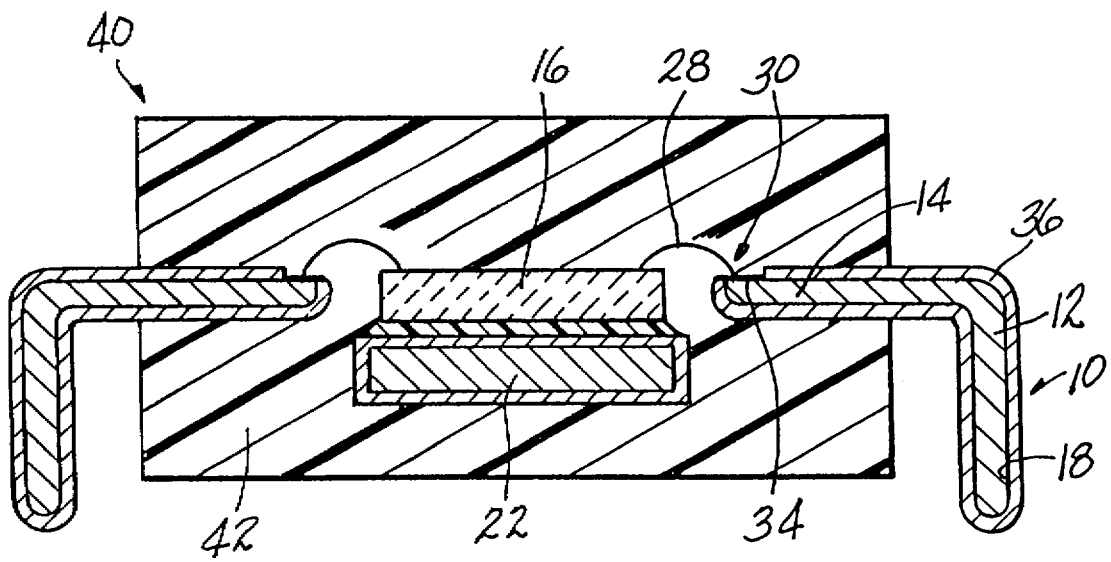
FIG. 3 illustrates a cross section of an electronic package in accordance with the present invention.

For example, FIG. 3 shows an embodiment according to the preferred invention illustrating a molded electronic package 40, wherein leadframe 10 is encapsulated in a molding resin 42. Reference numerals corresponding to FIGS. 1 and 2 serve the same function and have the same structure as the corresponding numerals in FIGS. 1 and 2.

Figure 4:
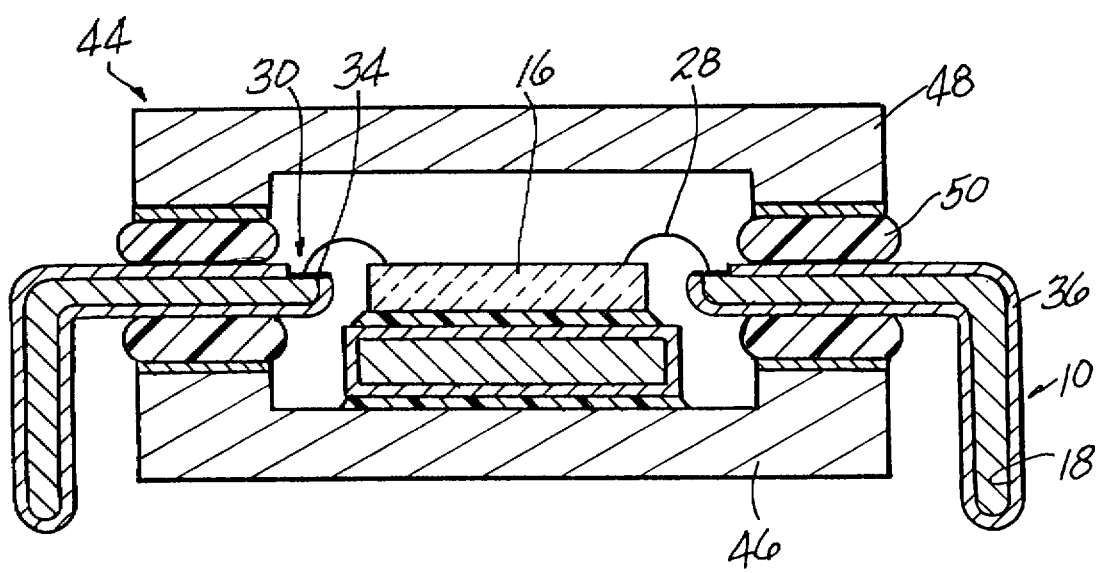
FIG. 4 illustrates a cross section of another electronic package in accordance with the present invention.

FIG. 4, for example, illustrates a preferred embodiment of the invention showing a metal electronic package 44. Metal electronic package 44 includes a metallic base 46 and metallic cover 48 bonded to leadframe 10 by polymer resin 50. Reference numerals corresponding to FIGS. 1 and 2 serve the same function and have the same structure as the corresponding numerals in FIGS. 1 and 2.

Preferred lasers include excimer, $CO_2$, and Yttrium-aluminum-garnet (YAG). Alternatively preferred lasers include any effective to remove package adhesion layer 36. Laser fluence depends on the type of coating to be removed. Furthermore, the relationship between laser fluence and the number of pulses required is inversely proportional. For example, the lower the laser fluence, the greater the number of pulses that are required. For example, laser fluence should be in excess of 1 J/cm$^2$/pulse for two pulses to remove an anti-tarnish layer of approximately 10 Å to 1000 Å thick, while a laser fluence of 2.2 J/cm$^2$/pulse requires only one pulse. Generally for an anti-tarnish layer, laser fluence should exceed 1 J/cm$^2$/pulse.

After removal of package adhesion layer 36, bonding layer 34 exhibits a surface characteristic of having been reflowed. As best understood by the inventors, reflow occurs when the localized heat generated by the laser when ablating package adhesion layer 36 partially melts and reflows bonding layer 34. Such reflowing occurs at temperatures in excess of the melting temperature of silver (about 860° C.).

When bonding layer is initially applied, typically by electrodeposition, its surface is typically uniform in texture and appears to have a dull matte finish as observed with the naked eye. After reflowing, however, the surface becomes non-uniform in texture and appears to have a shiny, wavy finish to the naked eye.

According to still another embodiment of the present invention, laser beam 52 is applied just prior to wire bonding to remove package adhesion layer 36.

In the embodiment discussed above, adhesion layer 36 is removed by laser ablation by a laser system and wires are subsequently bonded to leadframe 10 using a separate wire bonding machine. Alteratively, both laser ablation and wire bonding could be done nearly simultaneously by attaching a laser to the wire bonding machine. The laser could be directed at the wire bonding spot just about to be wire bonded by using, for example, optical fiber. The laser would thus move with the bonding head so that each successive spot to be wire bonded is laser ablated immediately prior to wire bonding.

According to still another embodiment, leadframe 10 is not coated with a bonding layer 34. Without bonding layer 34, the surface of leadframe 10 typically oxidizes prior to wire bonding. Typically, bonding layer 34 provides a surface which is relatively resistant to oxidation, thus providing a better surface to bond the wire 28.

Typically, a clean surface of leadframe 10 will provide good contact surface for bonding wires. By removing the layer of oxidation, a good, clean surface may be provided. According to a preferred embodiment, a laser beam 52 ablates the oxide layer at bonding sites 30. Immediately after ablation, bonding wires 28 are bonded at bonding sites 30. Thus, a wire may be reliably bonded directly to leadframe 10 without additional processing steps needed to add an adhesion enhancing layer 34. The invention according to the above two embodiments, would allow the use of copper wires.

In still another embodiment, leadframe 10 may have any number of layers in area 32. Laser beam 52 is applied just prior to wire bonding to remove all of the layers to leave a clean leadframe surface that provides a reliable wire bond surface.

The following example illustrates the advantages of the invention.

EXAMPLE 1

To demonstrate the effect of removing package adhesion layer 36, a leadframe 10, including an adhesion enhancing layer 34 covering inner lead portions 14 is completely coated with an anti-tarnish finish and laser ablated. An excimer laser beam is directed onto the center of the die attach pad 24, using different pulse values and numbers of pulses. Wire bonding tests are conducted to determine if the anti-tarnish coating is removed in the lased area. The bonding wires are then pull tested with a hook. A good bond is indicated when the wire itself breaks, rather than the bond.

Uncoated samples, wherein the metallic wire 28 is bonded directly to bonding layer 34, showed 100% breaks in the wires rather than at the bonding site 30. On the other hand, a completely coated sample not having the package adhesion layer 36 or anti-tarnish finish removed shows a predominant number of bond failures instead. The results are summarized in Table 1 and show that an adequately high laser fluence, for example, as little as one laser pulse, can ablate an anti-tarnish finish sufficiently to fully restore the wire bondability to an effective amount equal to a leadframe coated only with bonding layer 34.

TABLE 1

Effects of Laser Ablation on Anti-Tarnish Coated Leadframes

| Sample | Laser Fluence (J/cm$^2$/pulse) | # Pulses | Wire Bonding Results (% wire breaks) |
| --- | --- | --- | --- |
| No A2 | None | None | 100 |
| A2 Coated | None | None | 0–30 |
| A2 Coated | 1.4 | 2 | 85 |
| A2 Coated | 1.4 | 5 | 100 |
| A2 Coated | 1.4 | 20 | 100 |
| A2 Coated | 2.2 | 1 | 100 |
| A2 Coated | 2.2 | 2 | 100 |
| A2 Coated | 2.2 | 5 | 100 |
| A2 Coated | 2.2 | 10 | 100 |
| A2 Coated | 3.4 | 1 | 100 |
| A2 Coated | 3.4 | 2 | 100 |
| A2 Coated | 3.4 | 5 | 100 |
| A2 Coated | 3.4 | 10 | 100 |

This invention provides an improved wire to leadframe adhesion by removing any layer or layers that enhance the bond between a leadframe and a bonding resin or polymer, but degrade wire to leadframe adhesion.

It is apparent that there has been provided in accordance with this invention a circuit which fully satisfies the objects, means and advantages set forth hereinabove. While the invention has been described in combination with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

What is claimed is:

1. A method for improving adhesion from a leadframe to a metallic wire comprising the steps of:
   (a) providing the leadframe substantially coated with a coating which has a lower adhesion to the metallic wire than the leadframe;
   (b) applying a laser beam to selected areas of the coating to remove the coating, whereby the temperature of said selected areas exceeds the reflow temperature of said selected areas.

2. The method of claim 1, wherein the step of providing includes the substep of selecting the coating from the group consisting essentially of aluminum oxide, anti-tarnish finishes, and dielectrics.

3. The method of claim 1, wherein the step of providing includes the substep of providing a wire bond enhancing layer between the leadframe and the coating.

4. The method of claim 3, wherein the substep of providing a wire bond enhancing layer includes selecting the wire bond enhancing layer from the group consisting essentially of silver, nickel, palladium, gold, aluminum, and alloys thereof.

5. The method of claim 1, wherein the step of applying includes the substep of selecting the laser from the group consisting of $CO_2$, excimer, and YAG lasers.

6. The method of claim 4, wherein the step of applying includes the substep of selecting the laser from the group consisting of $CO_2$, excimer, and YAG lasers.

7. A method of attaching a metallic wire to a leadframe comprising the steps of:

(a) providing a leadframe;

(b) applying a laser beam to a wire bonding site, whereby the temperature of said wire bonding site exceeds the reflow temperature of said wire bonding site; and (c) bonding the wire to the wire bonding site.

8. The method according of claim 7, wherein the step of bonding occurs while the leadframe is partially melted at the wire bonding site.

9. The method of claim 7, wherein the step of applying includes the step of providing the laser beam with an optical fiber.

10. The method of claim 7, wherein the step of applying includes the substep of exposing a leadframe surface by ablating any layers present on the leadframe.

11. A method of attaching a metallic wire to a leadframe comprising the steps of:

(a) providing a leadframe;

(b) applying a laser beam to a wire bonding site, whereby the temperature of said wire bonding site exceeds the reflow temperature of said wire bonding site; and (c) bonding the wire to the wire bonding site, wherein said applying step and said bonding step occur nearly simultaneously.

* * * * *